(12) United States Patent
Lu

(10) Patent No.: US 9,358,555 B2
(45) Date of Patent: Jun. 7, 2016

(54) THREADED DISPENSE NOZZLE AND ALIGNMENT METHOD AND DEVICE FOR PHOTORESIST AND OTHER FLUID COATERS

(71) Applicant: WaferTech, LLC, Camas, WA (US)

(72) Inventor: Ping Chou Lu, Vancouver, WA (US)

(73) Assignee: WAFERTECH, LLC, Camas, WA (US)

( * ) Notice: Subject to any disclaimer, the term of this patent is extended or adjusted under 35 U.S.C. 154(b) by 0 days.

(21) Appl. No.: 14/203,095

(22) Filed: Mar. 10, 2014

(65) Prior Publication Data

US 2014/0263481 A1   Sep. 18, 2014

Related U.S. Application Data

(60) Provisional application No. 61/790,392, filed on Mar. 15, 2013.

(51) Int. Cl.
| | |
|---|---|
| *B05D 3/12* | (2006.01) |
| *B05B 1/00* | (2006.01) |
| *B05B 15/08* | (2006.01) |
| *B05B 13/02* | (2006.01) |
| *B05B 15/06* | (2006.01) |
| *B05D 1/00* | (2006.01) |
| *H01L 21/67* | (2006.01) |
| *B05B 13/04* | (2006.01) |

(52) U.S. Cl.
CPC . *B05B 1/00* (2013.01); *B05B 15/08* (2013.01); *B05B 13/0278* (2013.01); *B05B 13/0442* (2013.01); *B05B 15/065* (2013.01); *B05D 1/005* (2013.01); *H01L 21/6715* (2013.01)

(58) Field of Classification Search
CPC .. B05B 1/00; B05B 13/0278; B05B 13/0442; B05B 15/065; B05B 15/08; B05B 1/005; H01L 21/6715
USPC ............. 427/240, 425; 118/52, 320; 438/780, 438/782
See application file for complete search history.

(56) References Cited

U.S. PATENT DOCUMENTS

| | | | | |
|---|---|---|---|---|
| 4,607,588 | A * | 8/1986 | Stants et al. ..................... | 118/52 |
| 5,002,008 | A * | 3/1991 | Ushijima .............. | B05B 15/025 118/302 |
| 6,302,960 | B1* | 10/2001 | Baroudi et al. .................. | 118/52 |
| 2003/0211756 | A1* | 11/2003 | Ito ..................... | H01L 21/02126 438/782 |
| 2005/0181127 | A1* | 8/2005 | Hamada et al. ............... | 427/240 |
| 2005/0208222 | A1* | 9/2005 | DeMent et al. ............... | 427/356 |
| 2012/0318197 | A1* | 12/2012 | Ooshiro et al. ............... | 118/712 |

* cited by examiner

*Primary Examiner* — Kirsten Jolley
(74) *Attorney, Agent, or Firm* — Duane Morris LLP

(57) ABSTRACT

Provided is a fluid dispensing system with a dispense nozzle with a threaded outer surface and a fluid dispensing apparatus with a movable dispenser arm with an opening that includes threaded inner walls that receive the dispense nozzle therein. Also provided is a method for aligning a dispense head in a coating tool. Horizontal alignment is achieved by rotating the dispense nozzle until its tip is in contact with the chuck then laterally adjusting the dispenser arm position so that the tip is positioned over a center of the chuck. Vertical alignment is achieved by rotating the dispense nozzle until an indicia of the dispense nozzle is at the same vertical location as a designated physical feature of the dispenser arm.

22 Claims, 6 Drawing Sheets

THREADED DISPENSE NOZZLE AND ALIGNMENT METHOD AND DEVICE FOR PHOTORESIST AND OTHER FLUID COATERS

RELATED APPLICATION

This is a regular U.S. application claiming priority to U.S. Provisional Application Ser. No. 61/790,392, entitled Photoresist and Fluid Coater Centering and Height Adjustment Method and Device, filed Mar. 15, 2013, the contents of which are herein incorporated by reference as if set forth in their entirety.

TECHNICAL FIELD

The disclosure relates to coating equipment such as used in the semiconductor manufacturing industry, and more particularly to a dispenser arm and dispense nozzle system and method that provide for alignment of the dispense nozzle to the work piece being coated.

BACKGROUND

In semiconductor manufacturing and other industries, it is desirable to produce uniform coatings on substrates and other work pieces. This is particularly true in semiconductor manufacturing operations for coating substrates with a photoresist film. This is also true for other semiconductor coating operations such as spin-on glass or other spin-on dielectric coating operations, the application of various anti-reflective coating (ARC) materials, and various other coatings of permanent or sacrificial films used in semiconductor manufacturing. These films benefit from a uniform thickness throughout the substrate upon which they are coated. A uniform thickness throughout a substrate is particularly useful for a photoresist film, in particular, so that the dimensions of features produced using the photoresist coating as a mask, are uniform throughout the substrate including on the numerous integrated circuit devices formed on the substrate. This is especially true as substrate sizes become larger. With larger substrate sizes, there are more individual integrated circuits on a substrate and a greater area to be uniformly coated.

Coating operations are carried out using coating apparatuses that include a dispenser arm and a chuck that retains a substrate. The dispenser arm is positioned over the chuck and an amount of fluid is dispensed through a dispense nozzle onto the substrate received on the chuck. The chuck is then typically rotated in an attempt to uniformly spread the dispensed material across the substrate. These are delicate operations and if the dispenser nozzle is not centered over the chuck and in proper horizontal and vertical alignment with the chuck and substrate, a non-uniform coating can result.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

The disclosure, in various embodiments, provides a screw-like dispense nozzle, a coating apparatus with an adjustable dispenser arm that includes an opening for receiving the screw-like dispense nozzle, and a method for aligning the dispenser arm, both vertically and horizontally, with respect to a chuck that retains a substrate being coated.

The dispense nozzle includes a lumen, i.e. hollow cylinder, and an outer threaded surface. The dispense nozzle also includes a tip for dispensing fluids. In some embodiments, the dispense nozzle has a lower portion that is a tapered tip portion. The dispenser arm of a coating apparatus includes an opening with threaded inner surfaces for receiving the threaded outer surfaces of the dispense nozzle. In some embodiments, the opening is a vertical conduit. The screw-like dispense nozzle is rotatable to various vertical positions. In an embodiment, the dispenser arm is aligned by rotating the dispense nozzle until it contacts or nearly contacts the chuck to identify the position of the dispense tip relative to a center point of the chuck. In some embodiments, the chuck includes a recessed central point that receives the tip of the dispense nozzle when it is centered, i.e. when the dispense nozzle and dispenser arm are in proper horizontal alignment with the chuck.

In some embodiments, the threaded dispense nozzle includes an indicia that indicates that the dispense nozzle is in proper vertical alignment with respect to the chuck. This occurs when the indicia is at the same vertical position as a designated physical feature of the dispenser arm. In some embodiments, the indicia is an intersection between an upper threaded portion of the dispense nozzle and a lower tapered tip of the dispense nozzle.

Figure 1:
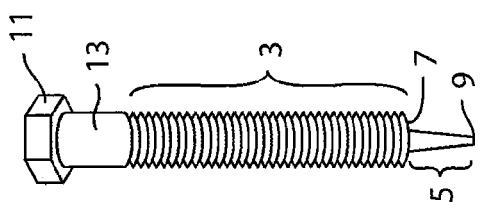
FIG. 1 is a side view of a threaded dispense nozzle according to various embodiments of the disclosure.

FIG. 1 shows an embodiment of a threaded dispense nozzle according to the disclosure. In some embodiments, threaded dispense nozzle 1 is made of Teflon, and in other embodiments, threaded dispense nozzle 1 is made of other suitable materials such as various polymers, plastics, and metals. In still other embodiments, other materials are used.

Threaded dispense nozzle 1 includes threaded portion 3 and tapered tip 5. Between threaded portion 3 and tapered tip 5 is intersection 7. Threaded dispense nozzle 1 includes a lumen that terminates at dispense port 9. Threaded dispense nozzle 1 also includes hexagonal head 11 in the illustrated embodiment. Hexagonal head 11 is provided for easy assembly and gripping to enable one to rotate threaded dispense nozzle 1 such as when received within a corresponding opening in a dispenser arm. Other head shapes and configurations that enable a user to grip and rotate threaded dispense nozzle 1, are used in other embodiments. In some embodiments, threaded dispense nozzle 1 also includes non-threaded portion 13. In the illustrated configuration, threaded portion 3 represents an upper portion and tapered tip 5 represents a lower portion. Referring now to both FIGS. 1 and 2, threaded portion 3 includes diameter 15 that is substantially constant throughout threaded portion 3.

Figure 2:
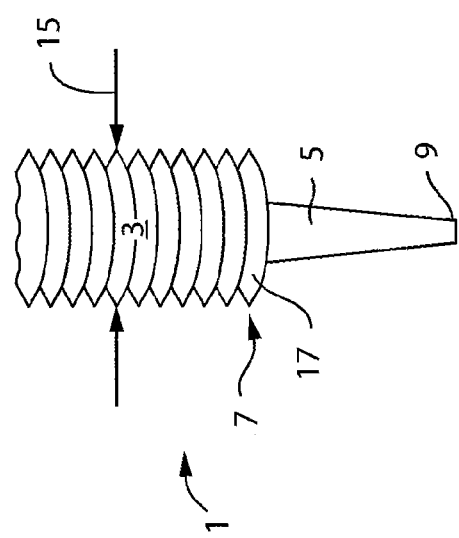
FIG. 2 is a close-up of a portion of the threaded dispense nozzle embodiment of FIG. 1.

In the embodiment illustrated in FIGS. 1 and 2, the widest diameter of tapered tip 5 is less than diameter 15 of threaded portion 3 and intersection 7 includes surface 17 which is substantially flat and downward facing in the illustrated orientation. In other embodiments, such as will be seen in FIG. 6, different arrangements are used for the threaded dispense nozzle 1. In some embodiments, surface 17 of intersection 7 serves as an indicia used for alignment. In other embodiments, threaded dispense nozzle 1 includes other indicia, for example, markings or other physical features or attributes that serve as indicia for alignment, as will be discussed below.

Figure 3:
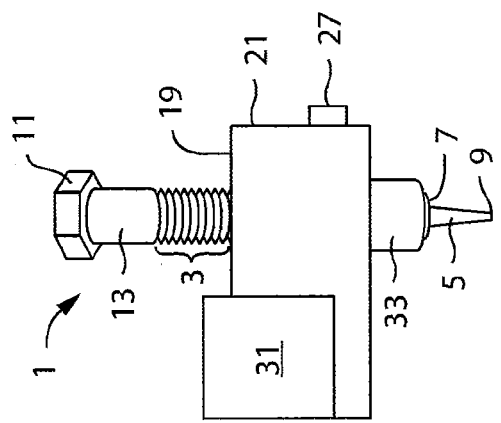
FIG. 3 shows an embodiment of a threaded dispense nozzle received within an opening in a component of a dispenser arm according to various embodiments of the disclosure.

FIG. 3 shows threaded dispense nozzle 1 received within an opening in component 21 of a dispenser arm. In some embodiments, component 21 is a jig. Component 21 includes top surface 19. Component 21 is a portion of a dispenser arm such as in various coating tools used in the semiconductor or other manufacturing industries. In an embodiment, the dispenser arm is part of a photoresist coating apparatus, and in other embodiments, the dispenser arm forms part of an apparatus used to coat substrates with spin-on dielectrics, anti-reflective coatings (ARCs) or other coatings used in the semiconductor manufacturing industry. FIG. 3 shows that the threaded portion 3 has a greater length than the opening in component 21. The opening in component 21 extends through cylinder 33 of component 21 and intersection 7 is positioned at the bottom of cylinder 33. The extended length of threaded portion 3 enables threaded dispense nozzle 1 to be positioned such that tapered tip 5 extends out of the bottom of component 21 to different distances This is useful in centering the dispenser arm and threaded dispense nozzle 1, as will be shown. Component 21 also includes connector portion 31 and nozzle sensor 27.

Figure 4:
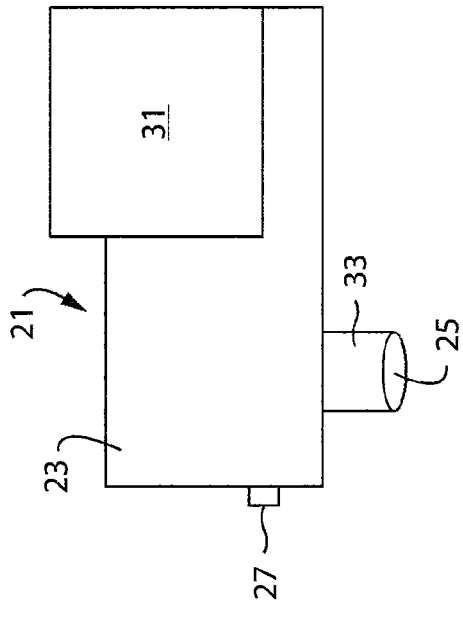
FIG. 4 is a plan view of a component of a dispense arm that receives a threaded dispense nozzle according to various embodiment of the disclosure.
Figure 5:
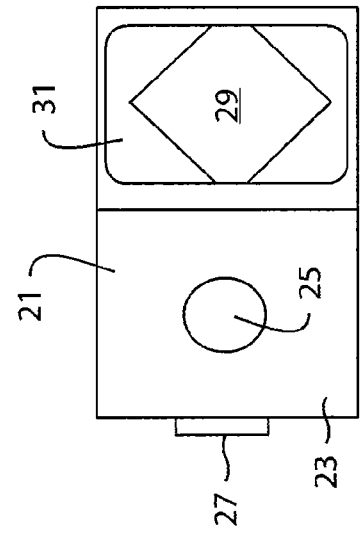
FIG. 5 is a side view of a component of a dispense arm that receives a threaded dispense according to various embodiment of the disclosure.

FIG. 4 is a top portion of component 21 and FIG. 5 is a side view of component 21 of a dispenser arm. Referring to FIGS. 4 and 5, component 21 includes end section 23 with opening 25. Opening 25 is a vertical opening when section 21 is joined to the dispenser arm and coating apparatus. End section 23 also includes nozzle sensor 27. Nozzle sensor 27 is a magnetic proximity sensor in various embodiments and is used to indicate that threaded dispense nozzle 1 is present in component 21. In other embodiments, other sensors are used. A set screw or other mechanical component (not shown) may be used to secure the position of threaded dispense nozzle 1 within component 21, once proper vertical alignment is achieved. Opening 25 has threaded inner surfaces and a diameter substantially equal to diameter 15 of threaded portion 3 so that the threads of threaded portion 3 mate with the threaded inner surfaces of opening 25 to hold threaded dispense nozzle 1 firmly in place. Connector portion 31 includes cavity 29 which may receive a protuberance from a dispenser arm in order to affix component 21 to the rest of the dispenser arm, in some embodiments, but other coupling means are used in other embodiments. FIG. 5 shows cylinder 33 that extends downwardly from component 21. Cylinder 33 also has threaded inner surfaces, i.e. opening 25 extends through cylinder 33.

Referring again to FIG. 3, threaded dispense nozzle 1 is received within opening 25 of component 21. In some embodiments, component 21 is made of aluminum or other suitably rigid materials and is joined to a dispenser arm by connector portion 31. The extra length of threaded portion 3 enables threaded dispense nozzle 1 to be screwed in and out of opening 25 such that dispense port 9 is at different vertical locations.

Figure 6:
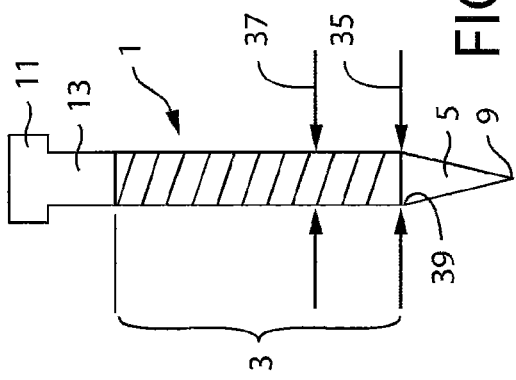
FIG. 6 is a side, schematic view of another of a threaded dispense nozzle according to various embodiments of the disclosure.

FIG. 6 shows another embodiment of threaded dispense nozzle 1. In the embodiment of FIG. 6, threaded dispense nozzle 1 includes threaded portion 3 and tapered tip 5, as well as dispense port 9. Threaded dispense nozzle 1 also includes non-threaded portion 13 and hexagonal head 11. One distinction between the threaded dispense nozzle embodiments shown in FIGS. 1 and 6, is that in the embodiment in FIG. 6, maximum diameter 35 of tapered tip 5 is the same as diameter 37 of threaded portion 3 at intersection 39.

Figure 7:
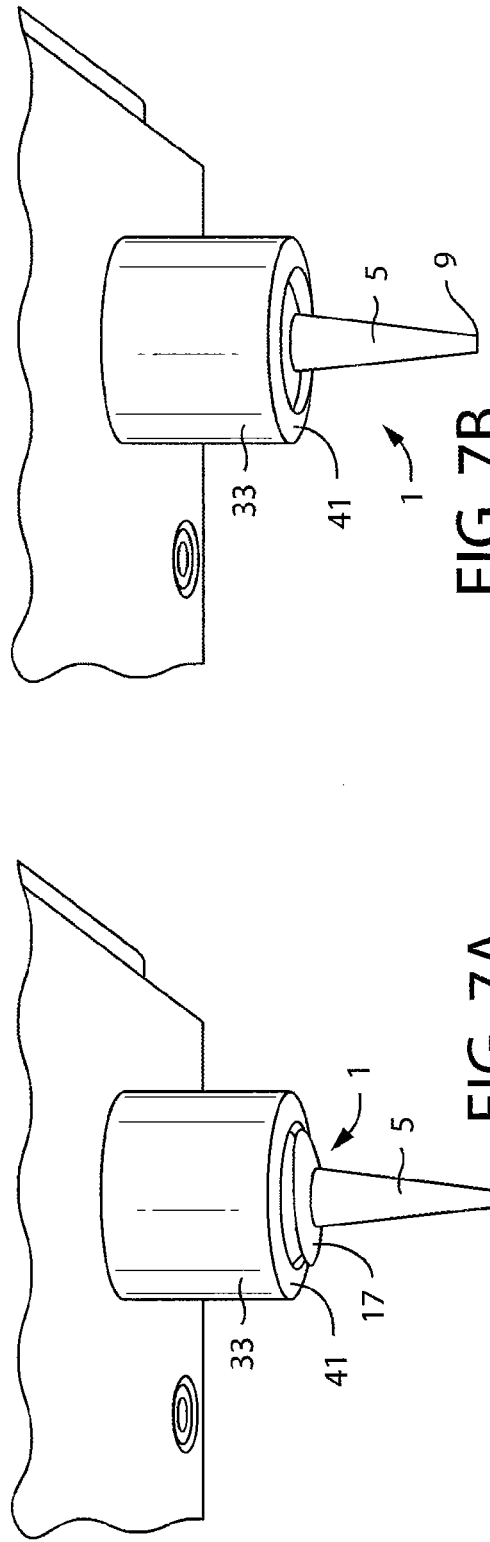
FIGS. 7A-7C show various positions of a threaded dispense nozzle received on a dispenser arm according to various embodiments of the disclosure.

FIGS. 7A-7C show a vertical alignment feature of threaded dispense nozzle 1 according to various embodiments of the disclosure. Each of FIGS. 7A-7C show cylinder 33 which forms part of component 21. Threaded dispense nozzle 1 is received within component 21 and cylinder 33 and includes tapered tip 5 that extends downwardly below cylinder 33. Tapered tip 5 includes dispense port 9. FIGS. 7A-7C illustrate how an indicia on threaded dispense nozzle 1 can be used in conjunction with a designated physical feature, indicia or attribute of component 21 to establish correct vertical alignment of threaded dispense nozzle 1.

In FIG. 7A, lower surface 41 of cylinder 33 represents a designated physical feature of the dispenser arm when component 21 is coupled to a dispenser arm. In FIG. 7A, surface 17 serves as an indicia of threaded dispense nozzle 1 and when surface 17 is at the same vertical position as lower surface 41 of cylinder 33, threaded dispense nozzle 1 is in proper vertical alignment. The length of threaded portion 3 of threaded dispense nozzle 1 allows for threaded dispense nozzle 1 to be rotated to achieve various vertical positions. In FIG. 7A, surface 17 is disposed below lower surface 41 and indicates that proper vertical alignment is not achieved because surface 17 is not at the same vertical location as lower surface 41.

FIG. 7B shows an arrangement in which surface 17 is located internally within cylinder 33 and therefore above lower surface 41. Surface 17 is not at the same vertical position as lower surface 41 and therefore threaded dispense nozzle 1 is not in proper vertical alignment. FIG. 7C shows surface 17 at the same vertical location as lower surface 41, and therefore threaded dispense nozzle 1 is in the proper vertical alignment. The threading of threaded portion 3 of threaded dispense nozzle 1 and of the inner surfaces of opening 25 allows for the vertical position of threaded dispense nozzle 1 to be easily adjusted by rotating.

Although surface 17 formed at intersection 7 of threaded dispense nozzle 1 serves as the indicia in the embodiment shown in FIGS. 7A-7C, in other embodiments, other features are used as indicia. In some embodiments, an indentation, protuberance or other marking on tapered tip 5 or other portions of threaded dispense nozzle 1 serves as the indicia. In some embodiments, the indicia may be included on non-threaded portion 13. Similarly, various designated physical features or markings of the dispenser arm may be used as the set point to which the indicia of threaded dispense nozzle 1 is aligned, i.e. positioned at the same vertical location, to ensure proper vertical alignment of threaded dispense nozzle 1. In some embodiments, the physical feature may be a top surface of component 21, such as top portion 19 of component 21. In other embodiments, other markings, features or other protuberances of component 21 or of other portions of the dispenser arm may serve as the designated physical feature to which the indicia of threaded dispense nozzle 1 is to be aligned.

It should also be understood that the particular configuration and arrangement of component 21 represents an embodiment, and that various different types, sizes and configurations of components and dispense arms are used in other embodiments. Threaded dispense nozzle 1 takes on various shapes and sizes in various embodiments. Threaded dispense nozzle 1 is characterized by a threaded outer surface received within a corresponding opening of a portion of a dispenser arm of a coating tool, but various different configurations are used in various embodiments.

Figure 8:
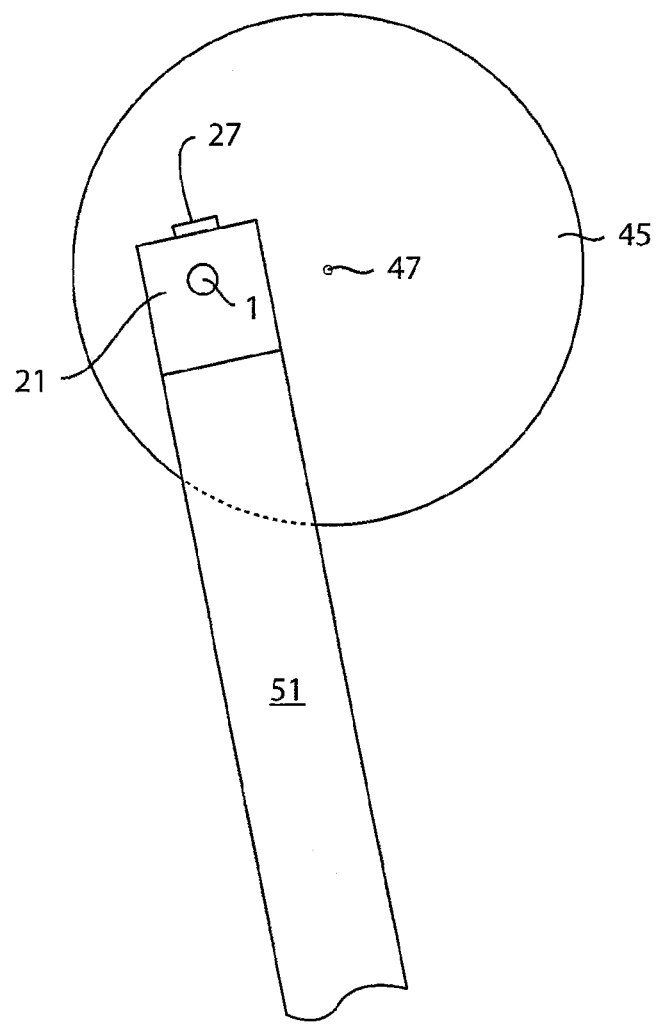
FIG. 8 shows a dispenser arm positioned over a chuck of a coating tool according to various embodiments of the disclosure.

FIG. 8 is a plan view showing a dispenser arm positioned over but not accurately aligned over a chuck in a coating tool. Dispenser arm 51 is a movable dispenser arm, at least in the lateral plane. Component 21 is coupled to, or forms part of dispenser arm 51, which represents various dispenser arms in various coating tools. Chuck 45 includes a centrally disposed recessed portion 47 that is adapted to receive a substrate to be coated. Threaded dispense nozzle 1 is secured within an opening in component 21 and nozzle sensor 27 may be a set screw or other mechanical component used to secure the position of threaded dispense nozzle 1 once proper vertical alignment is achieved. The arrangement shown in FIG. 8 shows dispenser arm 51 simply positioned over chuck 45 and component 21 and dispenser arm 51 can be generally, aligned so that component 21 is positioned over central recess 47 and then the system can be accurately centered as described in conjunction with FIGS. 9A-9C.

Figure 9A:
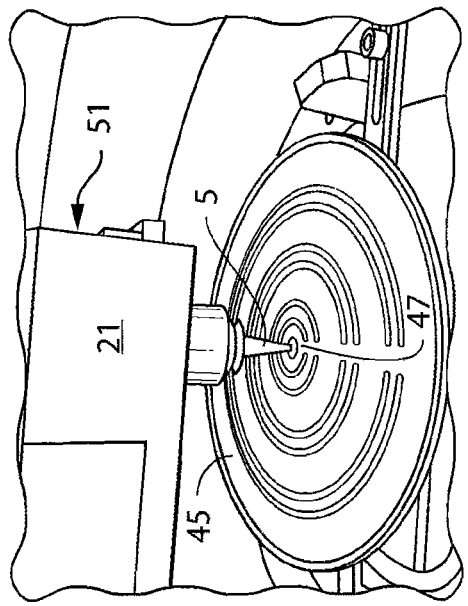
FIGS. 9A-9C show steps in an alignment/centering operation using an embodiment of a dispense nozzle according to various embodiments of the disclosure.
Figure 9B:
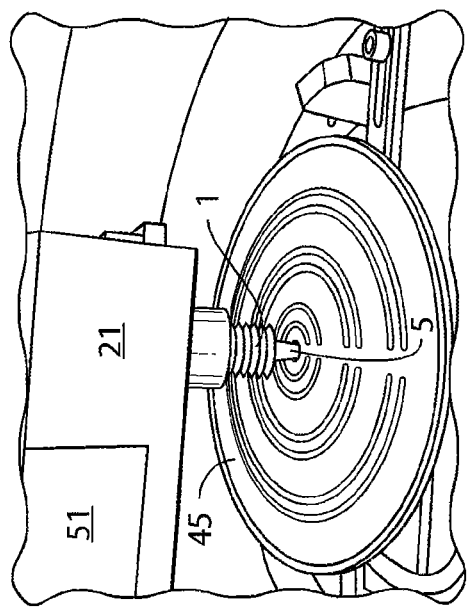
Figure 9C:
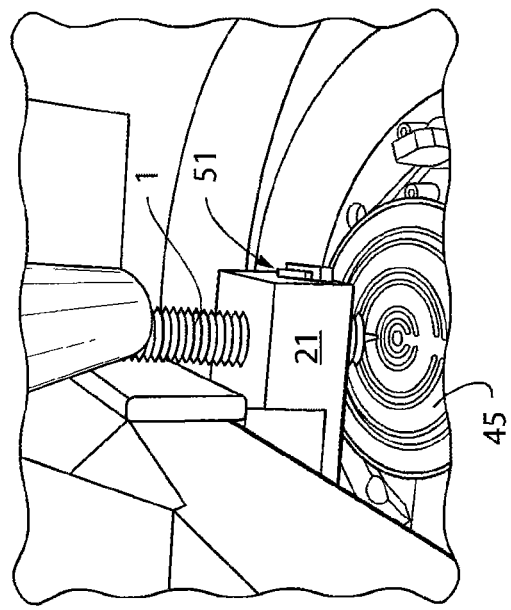

FIGS. 9A-9C illustrate a dispenser arm being centered, i.e. horizontally aligned, with a chuck utilizing the inventive threaded dispense nozzle for alignment purposes. FIG. 9A shows component 21 of dispenser arm 51 which retains threaded dispense nozzle 1. Dispenser arm 51 is part of a coating tool that also includes chuck 45. Dispenser arm 51 is movable laterally either by mechanical means, electronic means, or both mechanical and electronic means or other means. Chuck 45 is used for retaining a substrate or other work piece that is received thereon, and upon which a fluid is dispensed. Chuck 45 is rotatable so that once the fluid is dispensed on the substrate retained by chuck 45, rotation can be used to spread the dispensed fluid over the substrate.

In the embodiment of FIGS. 9A-9C, chuck 45 includes center recess 47. In other embodiments, chuck 45 includes a marking at the center point without a recess. In order to provide proper centering of threaded dispense nozzle 1 over chuck 45, dispenser arm 51 including component 21, is positioned over chuck 45. This is as shown in FIG. 9A. In FIG. 9B, threaded dispense nozzle 1 is rotated to lower dispense port 9 of tapered tip 5 to be in closer proximity to chuck 45. Threaded dispense nozzle 1 is lowered below its vertical alignment set point in order to determine the proper horizontal alignment. As threaded dispense nozzle 1 is rotated and tapered tip 5 increases in proximity to chuck 45, the actual degree of alignment is determined and the lateral position of the dispenser arm can be adjusted. In various embodiments, various means for lateral adjustment are used, including electronically adjusting the position and by mechanically adjusting the position. In FIG. 9C, tapered tip 5 is further lowered so that it is received within center recess 47 and this indicates that threaded dispense nozzle 1 and therefore the dispenser arm that retains threaded dispense nozzle 1 are centered over chuck 45, i.e. in proper horizontal alignment.

In an embodiment, dispenser arm 51 is generally aligned with respect to the chuck, the threaded dispense nozzle is lowered in increments, and the lateral position of the dispenser arm is adjusted incrementally until proper horizontal alignment is achieved when dispense port 9 of threaded dispense nozzle 1 touches the center point of chuck 45 or is received within recessed portion 47. According to this embodiment, the threaded dispense nozzle is then rotated upwardly until the indicia on threaded dispense nozzle 1 is at the same vertical location as the designated physical feature of the dispenser arm.

Figure 10:
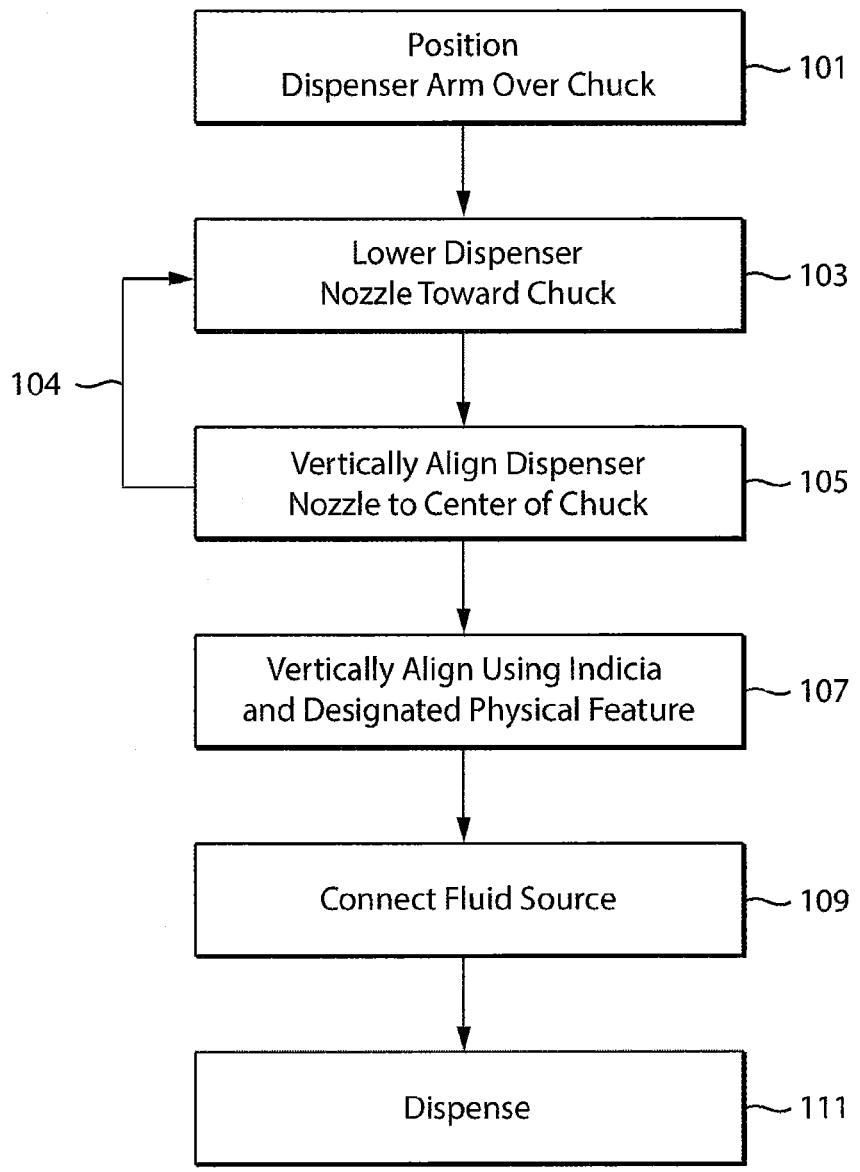
FIG. 10 is a flowchart of an alignment method according to various embodiments of the disclosure.

FIG. 10 is a flowchart showing an alignment method according to various embodiments of the disclosure. At step 101, a dispenser arm is positioned over a chuck. The chuck and dispenser arm are components of a coating tool such as a photoresist coating tool or other apparatuses used for coating substrates in the semiconductor manufacturing or other industries. Various sizes and orientations of dispenser arms are used and in some embodiments, a threaded dispense nozzle is already received within an opening in the dispenser arm. In some embodiments, the dispenser arm is dispenser arm 51 such as shown in FIGS. 9A-9C and the chuck is chuck 45 such as shown in FIGS. 9A-9C, but the description of FIG. 10 is not limited to the embodiment illustrated in FIGS. 9A-9C.

At step 103, the threaded dispense nozzle such as threaded dispense nozzle 1 if FIGS. 9A-9C, is lowered toward the chuck. This is done by rotation and may include introducing the threaded dispense nozzle to the dispenser arm if not done so already. At step 105, the dispenser arm is vertically aligned with respect to a center point of the chuck. This includes either or both of mechanical alignment or electronic positioning. Multiple iterations of steps 103 and 105 are used in various embodiments, i.e. in some embodiments, after the threaded dispense nozzle has its vertical alignment adjusted, it is further lowered and the process is repeated as indicated by arrow 104. In some embodiments, the dispense nozzle is lowered so that it contacts the center point of the chuck or such that it is received within a central recess of the chuck.

At step 107, vertical alignment of the threaded dispense nozzle is carried out using indicia on the threaded dispense nozzle and a designated physical feature of the dispenser arm. In various embodiments, the indicia may be surface 17 such as illustrated in FIGS. 7A-7C, but other suitable indicia are used in other embodiments. In some embodiments, vertical alignment is achieved by rotating the threaded dispense nozzle to a desired vertical position at which the indicia such as surface 17, is at the same vertical location as the designated physical feature such as, but not limited to lower surface 41 of FIGS. 7A-7C. The threaded dispense nozzle is set in position using a set screw such as the described nozzle sensor, or other mechanical members, in other embodiments. At step 109, the fluid source is connected to the threaded dispense nozzle after proper vertical and horizontal alignment have been achieved and dispense of the fluid occurs at dispense step 111. Various fluids are dispensed onto a substrate retained on the chuck, which is rotated after dispense and during dispense in some embodiments.

According to an embodiment, provided is a fluid dispensing system comprising: a dispense nozzle with a threaded outer surface, and a fluid dispensing apparatus with a movable dispenser arm with an opening therethrough, the opening having threaded inner walls adapted to receive the dispense nozzle therein.

In some embodiments, the opening is a vertical conduit and the threaded outer surface mates with the threaded inner walls when the dispense nozzle is received in the opening.

In some embodiments, the dispense nozzle includes an indicia and the dispense nozzle is in proper vertical alignment when the indicia is at the same vertical location as a designated physical feature of the dispenser arm.

In some embodiments, the threaded outer surface forms an upper portion of the dispense nozzle and the dispense nozzle further comprises a tapered tip forming a lower portion thereof, and the dispense nozzle includes an indicia that indicates that the dispense nozzle is in proper vertical alignment when the indicia is aligned with a designated physical feature of the dispenser arm.

In some embodiments, the indicia is an intersection between the upper portion and the lower portion and the designated physical feature of the dispenser arm is a further horizontal surface.

In some embodiments, the opening is a vertical conduit, the dispenser arm includes a jig that includes the opening therethrough and the designated physical feature of the dispenser arm is a bottom, downward facing horizontal surface of the jig.

In some embodiments, the upper portion includes a substantially constant diameter, a widest section of the lower portion includes a maximum diameter less than the substantially constant diameter, and the indicia is a horizontal surface at an intersection between the upper portion and the lower portion.

In some embodiments, the dispenser apparatus includes a chuck, the movable dispenser arm is laterally positionable over the chuck, and the upper portion includes a height that enables the dispense nozzle to be rotated into a position in which the tapered tip contacts the chuck.

In some embodiments, the upper portion includes a substantially constant diameter, a widest section of the lower portion includes a maximum diameter substantially the same as the substantially constant diameter, and the fluid dispensing apparatus comprises a photoresist coater.

According to one aspect, provided is a dispense nozzle comprising a tubular member with a lumen therein and including an upper straight portion, a lower tapered tip and an intersection therebetween, the upper straight portion having a threaded outer surface.

In some embodiments, the upper straight portion includes a constant outer diameter, the tapered tip includes a maximum outer diameter less than the constant outer diameter and the intersection comprises an alignment indicia for indicating vertical alignment when the dispense nozzle is rotatably coupled to a dispense apparatus.

In some embodiments, the upper portion includes a constant outer diameter, the lower tapered tip includes a maximum diameter equal to the constant outer diameter and further including an alignment indicia for indicating vertical alignment when the dispense nozzle is rotatably coupled to a dispense apparatus.

According to one aspect, provided is a method. The method comprises: coupling a dispense nozzle of a fluid dispensing apparatus to an opening of a movable dispenser arm of the fluid dispensing apparatus by rotating the dispense nozzle such that threaded outer walls of the dispense nozzle mate with threaded inner walls of the opening; and, aligning the dispense nozzle and the dispenser arm to a chuck of the fluid dispensing apparatus, the chuck for receiving a substrate thereon.

In some embodiments, the aligning comprises positioning the dispenser arm over the chuck; further rotating the dispense nozzle until a tip of the dispense nozzle is substantially in contact with the chuck; and laterally adjusting a position of the dispenser arm such that the tip is aligned over a center point of the chuck.

In some embodiments, the laterally adjusting comprises one of mechanically adjusting and electronically positioning.

In some embodiments, the adjusting further comprises vertically aligning by rotating the dispense nozzle until an indicia of the dispense nozzle is at the same vertical location as a designated physical feature of the dispenser arm. and further comprising coating a substrate on the chuck by dispensing fluid through the dispense nozzle, after the adjusting.

In some embodiments, the aligning comprises vertically aligning by rotating the dispense nozzle until an indicia of the dispense nozzle is at the same vertical location as a designated physical feature of the dispenser arm.

In some embodiments, the indicia comprises an intersection between an upper portion of the dispense nozzle including the threaded outer walls and a lower, tapered tip portion of the dispense nozzle.

In some embodiments, the indicia comprises a horizontal surface at the intersection, the designated physical feature of the dispenser arm comprises a horizontal surface and further comprising coating a substrate on the chuck by dispensing photoresist through the dispense nozzle.

In some embodiments, the aligning comprises: horizontally aligning by positioning the dispenser arm over the chuck, further rotating the dispense nozzle until a tip of the dispense nozzle is substantially in contact with the chuck, and laterally adjusting a position of the dispenser arm such that the tip is aligned over a center point of the chuck; and vertically aligning by rotating the dispense nozzle until an indicia of the dispense nozzle is at the same vertical location as a designated physical feature of the dispenser arm.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method comprising:
    coupling a dispense nozzle of a fluid dispensing apparatus to an opening of a movable dispenser arm of said fluid dispensing apparatus by rotating said dispense nozzle such that threaded outer walls of said dispense nozzle mate with threaded inner walls of said opening; and
    positioning said dispense nozzle and said dispenser arm with respect to a chuck of said fluid dispensing apparatus by rotating said dispense nozzle until said tapered tip of said dispense nozzle is substantially in contact with said chuck, said chuck for receiving a substrate thereon,
    wherein said dispense nozzle includes an upper straight portion with a constant outer diameter and said threaded outer walls, a lower portion that tapers to a tapered tip and an intersection between said upper straight portion and said lower portion, said lower portion including a maximum outer diameter no greater than said constant outer diameter.

2. The method as in claim 1, wherein said positioning said dispense nozzle and said dispenser arm with respect to a chuck comprises
    positioning said dispenser arm over said chuck; and
    laterally adjusting a position of said dispenser arm such that said tapered tip is positioned over a center point of said chuck.

3. The method as in claim 2, wherein said laterally adjusting comprises one of mechanically adjusting and electronically positioning.

4. The method as in claim 2, wherein said positioning said dispense nozzle and said dispenser arm with respect to a chuck includes vertically positioning said dispense nozzle and said dispenser arm with respect to said chuck by rotating said dispense nozzle until a feature of said dispense nozzle is at the same vertical location as a feature of said dispenser arm and further comprising coating a substrate on said chuck by dispensing fluid through said dispense nozzle, after said laterally adjusting.

5. The method as in claim 1, wherein said positioning said dispense nozzle and said dispenser arm with respect to a chuck comprises vertically positioning by rotating said dispense nozzle until a feature of said dispense nozzle is at the same vertical location as a feature of said dispenser arm.

6. The method as in claim 5, wherein said feature of said dispense nozzle comprises said intersection.

7. The method as in claim 6, wherein said feature of said dispense nozzle comprises a horizontal surface at said intersection, said feature of said dispenser arm comprises a horizontal surface and further comprising coating a substrate on said chuck by dispensing photoresist through said dispense nozzle.

8. The method as in claim 1, wherein said positioning said dispense nozzle and said dispenser arm with respect to a chuck comprises:
    laterally adjusting a position of said dispenser arm such that said tapered tip is positioned over a center point of said chuck; and
    vertically positioning by rotating said dispense nozzle until a feature of said dispense nozzle is at the same vertical location as a feature of said dispenser arm.

9. The method as in claim 1, wherein said dispense nozzle is a tubular member with a lumen therein.

10. The method as in claim 9, wherein said positioning said dispense nozzle and said dispenser arm with respect to said chuck comprises vertically positioning by rotating said dispense nozzle until a feature of said dispense nozzle is at a desired vertical position with respect to a feature of said dispenser arm, said feature of said dispense nozzle comprising said intersection.

11. The method as in claim 10, wherein said maximum outer diameter of said lower portion is less than said constant outer diameter.

12. A method comprising:
    coupling a dispense nozzle of a fluid dispensing apparatus to an opening of a movable dispenser arm of said fluid dispensing apparatus by rotating said dispense nozzle such that a threaded outer surface of said dispense nozzle mates with a threaded inner surface of said opening; and
    laterally adjusting a position of said dispenser arm such that said tip of said dispense nozzle is positioned over a center point of said chuck, then
    positioning said dispense nozzle with respect to a chuck for receiving a substrate thereon, by rotating said dispense nozzle until a feature of said dispense nozzle is at the same vertical location as a feature of said dispenser arm and said dispense nozzle includes a tip positioned below said dispenser arm.

13. The method as in claim 12, wherein said positioning said dispense nozzle with respect to a chuck further comprises
    positioning said dispenser arm over said chuck.

14. The method as in claim 12, wherein said feature of said dispense nozzle comprises an intersection between an upper portion of said dispense nozzle including said threaded outer surface, and a lower, tapered tip portion of said dispense nozzle that includes said tip.

15. The method as in claim 14, wherein said feature of said dispense nozzle comprises a horizontal surface at said intersection, said feature of said dispenser arm comprises a horizontal surface.

16. The method as in claim 15, wherein said upper portion includes a constant outer diameter and said tapered tip portion includes a maximum outer diameter less than said constant outer diameter.

17. The method as in claim 12, wherein said positioning said dispense nozzle with respect to a chuck for receiving a substrate thereon, by rotating said dispense nozzle, includes moving said dispense nozzle such that said tip extends out of a bottom of said movable dispenser arm to different distances.

18. A method comprising:
    coupling a dispense nozzle to an opening of a movable dispenser arm of a fluid dispensing apparatus;
    positioning said movable dispenser arm over a chuck of said fluid dispensing apparatus;
    rotating said dispense nozzle such that a threaded outer surface of said dispense nozzle mates with a threaded inner surface of said opening, until a tip of said dispense nozzle is substantially in contact with said chuck;
    laterally adjusting a position of said dispenser arm such that said tip is positioned directly over a center point of said chuck; and after said laterally adjusting, vertically positioning said dispense nozzle with respect to said dispenser arm and said chuck by rotating said dispense nozzle until a feature of said dispense nozzle is at the same vertical position as a feature of said dispenser arm.

19. The method as in claim 18, wherein said dispense nozzle comprises a tubular member with a lumen therein and includes an upper straight portion including said threaded outer surface, a lower tapered tip portion including said tip, and said feature of said dispense nozzle is an intersection between said upper straight portion and said lower tapered tip position.

20. The method as in claim 18, wherein said feature of said dispense nozzle comprises a horizontal surface and said feature of said dispenser arm comprises a lowermost surface of said dispenser arm.

21. The method as in claim 18, wherein said coupling comprises rotating said dispense nozzle to cause said threaded outer surface of said dispense nozzle to mate with said threaded inner surface of said opening.

22. A method comprising:
coupling a dispense nozzle of a fluid dispensing apparatus to an opening of a movable dispenser arm of said fluid dispensing apparatus by rotating said dispense nozzle such that threaded outer walls of said dispense nozzle mate with threaded inner walls of said opening; and
positioning said dispense nozzle and said dispenser arm with respect to a chuck of said fluid dispensing apparatus, said positioning including adjusting a vertical position of said dispense nozzle with respect to said chuck by rotating said dispense nozzle after laterally positioning said dispenser arm over a center point of said chuck,
wherein said chuck is configured to receive a substrate thereon.

* * * * *